United States Patent
Braneci et al.

(10) Patent No.: US 6,857,096 B1
(45) Date of Patent: Feb. 15, 2005

(54) METHOD OF THE ARQ TYPE FOR A TRANSMISSION METHOD USING TURBOCODES, AND ASSOCIATED DEVICE

(75) Inventors: Mohamed Braneci, Rennes (FR); Patrice Nezou, Bruz (FR); Pascal Rousseau, Rennes (FR)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/546,686

(22) Filed: Apr. 11, 2000

(30) Foreign Application Priority Data

Apr. 13, 1999 (FR) .......................................... 99 04598

(51) Int. Cl.⁷ ........................ H03M 13/00; G06F 11/00
(52) U.S. Cl. ..................................... 714/751; 714/701
(58) Field of Search ............................... 714/701, 712, 714/748, 751

(56) References Cited

U.S. PATENT DOCUMENTS

| 5,729,560 | A | | 3/1998 | Hagenauer et al. ......... 371/143 |
| 5,734,962 | A | * | 3/1998 | Hladik et al. .............. 455/12.1 |
| 5,991,831 | A | * | 11/1999 | Lee et al. ..................... 710/33 |
| 6,023,783 | A | * | 2/2000 | Divsalar et al. ............ 714/792 |
| 6,181,683 | B1 | * | 1/2001 | Chevillat et al. ........... 370/329 |
| 6,182,260 | B1 | * | 1/2001 | Kang et al. .................. 714/755 |
| 6,304,991 | B1 | * | 10/2001 | Rowitch et al. ............ 714/755 |
| 6,370,670 | B1 | * | 4/2002 | Le Dantec et al. ......... 714/781 |

FOREIGN PATENT DOCUMENTS

| DE | 19736676 C | 12/1998 |
| EP | 0749211 A3 | 12/1996 |
| EP | 0749211 A2 | 12/1996 |
| EP | 0928071 A1 | 7/1999 |
| WO | WO 99/11010 | 3/1999 |

OTHER PUBLICATIONS

"A Distance Spectrum Interpretation of Turbo Codes" by Perez et al. in IEEE Transactions on Information Theory vol. 42 No 6 Nov. 1996.*

Narayanan et al. A Novel ARQ Technique Using The Turbo Coding Principle, IEEE Comm. Letters, vol. 1, No. 2, (Mar. 2, 1997), pp. 49–51.

Narayanan et al., "Physical Layer Design For Packet Data Over IS–136," IEEE Vehicular Tech. Conf., vol. Conf. 47, p. 1029–1033.

Burkert, Frank et al., *Turbo Decoding with Unequal Error Protection Applied to GSM Speech Coding*, Department of Communications, Engineering, Technical University of Munich, (1996), pp. 2044–2048.

\* cited by examiner

*Primary Examiner*—Albert Decady
*Assistant Examiner*—Cynthia Britt
(74) *Attorney, Agent, or Firm*—Fitzpatrick, Cella, Harper & Scinto (57) ABSTRACT

An information packet transmission device for a communication system has a transmission part and a reception part, at least one of the transmission or reception parts having a turbocoder, and an external interleaver upstream of the turbocoder. The turbocoder preferentially has an interleaver, and a deinterleaver of the "x to $x^e$" type. The external interleavers are of the row column or column row type.

46 Claims, 6 Drawing Sheets

| ID | ARQ | Parameters | V(S) | V(R) | Priority |
|---|---|---|---|---|---|
| 0 | No ARQ | TR, CDV, Deadline | 2 | 5 | RT |
| 1 | GBN | | 5 | 1 | NRT |
| 2 | GBN | | 2 | 2 | NRT |
| 3 | No ARQ | TR, CDV, Deadline | 3 | 4 | RT |

Figure 9 a) SW  b) GBN  c) SR

Figure 10 a) SW  b) GBN  c) SR

METHOD OF THE ARQ TYPE FOR A TRANSMISSION METHOD USING TURBOCODES, AND ASSOCIATED DEVICE

BACKGROUND OF THE INVENTION

1. Field of the Invention

The invention lies in the general field of communication systems. It concerns in particular an acknowledgement method (ARQ method) adapted to the distribution of errors in a communication system using turbocodes. It also concerns more precisely an external code associated with a data formatting means which allows the detection of residual errors at the output from a turbodecoder, taking account of the characteristics related to the use of a turbocode based on an interleaver of the so-called "x to $x^e$" type.

It applies equally well to the coding of data representing a physical quantity, to the coding of data in the form of codes able to modulate a physical quantity, to the decoding of data modulated signals, and to the decoding of data representing physical quantities or to the management of data retransmissions. These data can, for example, represent images, sounds, computer data, electrical quantities or stored data.

2. Description of the Related Art

When convolutional coders are used for implementing an iterative decoding, these codes are greatly improved when their coders contain a permuting device (referred to as an "interleaver", a permuting device make it possible to return to the initial sequence then being referred to as a "de-interleaver). In this case, they are normally referred to as "turbocodes" and the corresponding iterative decoder is referred to as a "turbodecoder". For convenience:
- the operation performed by the turbocoder is referred to as "turbocoding" and this operation supplies a so-called "turbocoded" sequence
- the operation performed by the turbodecoder is referred to as "turbodecoding" and this operation supplies a so-called "turbodecoded" sequence.

On these subjects, documents which serves as a reference are on the one hand the article by C. BERROU, A. GLAVIEUX and P. THITIMAJSHIMA entitled <Near Shannon limit error-correcting coding and decoding: turbocodes> published in the reports on the conference ICC'93, 1993, pages 1064 to 1070, and on the other hand the article by C. BERROU and A. GLAVIEUX entitled <Near Optimum error-correcting coding and decoding: turbo-codes> published in IEEE Transactions on Communications, Volume 44, pages 1261 to 1271, in October 1996.

A parallel turbocoder with an efficiency of ⅓ can be considered to be a pair of systematic recursive convolutional coders with divisor polynomials such that the first coder produces a control sequence from the sequence of symbols to be coded a and the second coder produces a control sequence from a sequence $\underline{a}^*$ obtained by interleaving (or "permuting") of the sequence $\underline{a}$.

In this context, the simultaneous return to zero of the two codes affords better decoding.

For the purpose of clarity, it will be assumed hereinafter that the two divisor polynomials of the turbocoder are equal and termed g(x). Let m be the degree of the polynomial g(x) and let $N_0$ be the smallest integer such that g(x) is a divisor of the polynomial $1+x^{N_o}$. For reasons described later, a polynomial g(x) is chosen for which no divisor is the square of a polynomial of degree equal to or greater than 1, and this means that $N_0$ is an odd number.

Let N be the size of the sequence $\underline{a}$ chosen so that it is an odd multiple of $N_0$: $N = M \cdot N_0$.

A sequence of information symbols $\underline{u}$ to be turbocoded must then have a polynomial representation u(x) with binary coefficients of degree N-m-1. This sequence u(x) is precoded (or "formatted") and:

$$a(x) = u(x) + \sum_{i=N-m}^{N-1} a_i x^i$$

where the m binary symbols $a_i$ are chosen so that a(x) is a multiple of g(x). As a consequence of this formatting (preceding) and the chosen values of the parameters, if a(x) is a multiple of g(x), then $a^*(x) = a(x^e)$ modulo $1+x^N$ is also a multiple of g(x) for any value of e which is a power of 2. It is necessary to consider that g(x) has no multiple factor because, in general, $a^*(x)$ has the guarantee of being divisible only by the irreducible factors of g(x).

In the remainder of the description, "x to $x^e$" is the term given to the type of permuting and interleavers mentioned above. The "x to $x^e$" type interleaver is well known in the art. For an example, reference is made to U.S. Pat. No. 6,370,670 B1, to Le Dantec et al.

With general turbocodes, decoding is essentially an iterative procedure (see in this regard the document by C. BERROU and A. GLAVIEUX, <Near optimum error-correcting and decoding: turbocodes>, IEEE Trans. on Comm., vol. COM-44, pages 1261–1271, October 1996).

To increase the quality of a communication system using a noisy transmission channel, there are two distinct approaches:
- the first uses error correction codes (ECC) which add redundancy to the information packet before transmission. This redundancy is used for detecting and correcting errors.
- the second approach uses an automatic retransmission protocol known as ARQ, which uses solely error detection means without seeking to correct them. When an error is detected in an information packet, a request for retransmission is sent by the receiver.

Finally, a so-called hybrid ARQ method which is a combination of the above two approaches is sometimes used in order to reduce the number of retransmission requests.

Bertsekas and Gallager (Data networks, Prentice Hall Intl Ed., section 2.4, 1992) describe the three basic ARQ retransmission strategies: SW, GBN and SR.

SW (Stop and Wait): a new transmission can take place only when the previous transmission has been acknowledged.

GBN (Go back N): this method is probably the most widely used. Its principle is simple, several successive packets numbered sequentially can be sent without awaiting acknowledgement of the previous transmission. When an acknowledgement is received for a packet N, all the packets which preceded are also acknowledged. This retransmission technique uses an anticipation window, which limits the maximum number of sendings of packets without acknowledgement.

When an error is detected on a packet M by the receiver, the latter rejects any packet whose serial number is higher, and demands the resumption of the transmissions from the erroneous sequence number, and thus the receiver receives the packets in an ordered fashion.

SR (Selective Repeat): the principle of this method is close to the GBN method except that only the erroneous packet in a successive stream of packets is retransmitted. This method therefore requires the reordering of the packets on reception.

A document by Naraywan and Stuber (A novel ARQ technique using the turbo codes principle, IEEE communications letters, March 1997) describes an acknowledgement method of the "Stop and Wait" type using an pseudo-random interleaver before turbocoding of the data for any retransmission.

On decoding, when an erroneous packet is detected, a NACK (non-acknowledgement) signal is sent and the soft outputs of the decoder are stored to memory. On receiving the retransmission, the decoder uses the soft outputs as a priori information (iterative process).

It should be noted that this method requires the use of a modified pseudo-random interleaver, which is expensive in terms of memory. In addition, this method requires the complete retransmission of the initially transmitted data.

J Hamorsky, U Wachsmann, J B. Huber and Anton Cizmar (Hybrid automatic repeat request scheme with turbo codes, International Symposium on turbo codes, 1997) determine the state of the turbodecoder after reception of the packet: convergence, divergence or instability. If the decoder has converged, the packet is accepted and no retransmission is requested. When the decoder diverges, a retransmission request is sent.

Where the iterative process of the decoder is unstable, the hybrid ARQ method is used. For this purpose, the bit error rate is estimated in order to stop the process of iteration of the decoder when this error rate is at a minimum. Next, decoding by ECC (error correction code) is effected, which makes it possible to limit the retransmission request.

It is found that this method requires the use of additional redundancy apart from the use of an ECC. The quantity of redundancy necessary will be a function of the required connection capacity, but it will reduce the available passband accordingly. Moreover, if the correction capacities of the ECC are exceeded, retransmission is complete.

Wai-Chung Chan and Evaggelos Geraiotis (An adaptive hybrid ECC/ARQ protocol using turbo codes, International conference on UPC, October 1997) describe a hybrid ARQ protocol with retransmissions where the coding efficiency decreases when the errors increase. They use the technique of puncturing in order to obtain coding efficiencies ½ and ⅔. Then, according to the quality of the channel, the number of transmissions effected and the application used (voice or data), the appropriate coding efficiency is chosen for sending the following packet and using an SW method.

This proposal uses a different strategy in order to limit the quantity of information to be transmitted since it acts on the coding rate. This requires the setting up of a protocol between the sender and receiver in order to use the same coding rate. This method can therefore be applied only at low frequency.

SUMMARY OF THE INVENTION

The aim of the invention is therefore to remedy the aforementioned drawbacks:
 use of a pseudo-random interleaver which is expensive in terms of memory and the requirement for complete retransmission of the data transmitted,
 or the requirement for additional redundancy in order to use an ECC,
 or a method limited to low frequency.

In more general terms, the objective of the invention is to offer a reliable means of transmitting information packets which are sent to it as a function of the required service quality.

More particularly, the invention seeks to mitigate the residual errors after turbodecoding.

The invention is presented as an alternative to the solutions proposed in the state of the art, and can be combined with the ideas proposed in the state of the art.

To this end, the invention proposes a device for sending information packets coming from a source for a communication system, having a turbocoder and an external interleaver upstream of the turbocoder.

Preferentially, the turbocoder has an interleaver of the type "x to $x^e$".

According to a preferred embodiment, the external interleaver is of the row column or column row type.

The invention is based on the fact that the use of an interleaver of the type "x to $x^e$" gives a particular form to the residual errors when in an environment with a high signal/noise ratio (noisy transmission channel).

The particular fashion of interleaving the data with an interleaver of the "x to $x^e$", type means that the residual errors occur in pairs, on one or more columns depending on the signal to noise ratio ($Eb/N_0$).

The invention then effectively supplies a means for the reliable transmission of information packets which are sent to it as a function of the required service quality, following a retransmission strategy measuring the quality of the information transmitted.

According to a particular embodiment, the sending part has a logic link controller placed between the source and the turbocoder, the said logic controller having in combination the column-row interleaving means, an external coding means and a retransmission management means.

These provisions correspond to a simple implementation of the invention.

The logic link controller also has a segmentation/reassembly unit, and the retransmission management means comprises an ARQ unit and a link control unit interfaced with the segmentation/reassembly unit and the ARQ unit.

According to several provisions advantageously used in conjunction,
 the link control unit has means for referencing the data flows sensitive to the delays introduced into the transportation of the information packets Pi in a first table of priority segments, and the data flows insensitive to the delays introduced for the transportation of the information packets Pi in a second table of non-priority segments,
 the segmentation/reassembly unit has means of dividing the information packets Pi coming from the source into segments of predetermined fixed size, and adding two bits to each of said segments, thus forming a packet PS,
 the ARQ unit has means for adding a header to each segment packet PS, thus forming an ARQ packet; this header then preferably contains a field which makes it possible to identify the ARQ instance to which this ARQ packet belongs,
 the ARQ unit has means for supplying, to the coding unit of the CRC, a sequence $\underline{u}=(u_0, u_1, \ldots U_{R-1})$ (or u(x) in a polynomial form or U in an equivalent matrix form) of length [L], composed from the ARQ packets.

According to a preferred embodiment, the logic link controller has means for implementing two operating modes for the acknowledgement protocol: SAI method (Single ARQ Instance) or MAI method (multiple ARQ instances).

The invention also relates to a reception device, having a turbodecoder and an external interleaver upstream of the turbocoder.

Likewise, the turbodecoder has a deinterleaver of the type "x to $x^e$".

In a third aspect, the invention relates to a transceiver, comprising a sending device or a reception device as succinctly disclosed above.

The invention also relates, in a fourth aspect, to a method of sending information packets Pi for a communication system, having a sending part and a reception part, connected by a noisy channel, characterised in that the transmission of the information packets Pi comprises the following steps:

formatting data a(x) from information packets Pi, column row interleaving of these data, turbocoding by means of a turbocoder with an interleaver of the type "x to $x^e$", modulation and sending over the transmission channel.

This arrangement, which uses a combination of a column row interleaving means and a retransmission management means (in the formatting of the data), makes it possible to limit the quantity of information to be transmitted and therefore to deal with the problem posed.

According to various arrangements, possibly used in conjunction, the data formatting step includes steps of:

dividing the information packets Pi into information segments Si of fixed maximum length, and formatting into segment packets of PS of predetermined fixed length, transforming the segment packets PS into ARQ packets having an ARQ instance identifier, choosing $N_0$ information segments (ARQ packets) to be transmitted, $N_0$ being a predetermined value.

Preferentially, the choice of said $N_0$ segments is a function of a priority associated with each flow, the signal to noise ratio (SNR) of the transmission channel, retransmissions to be effected, and the number of segments available or retransmission.

According to a preferred implementation, the choice of said $N_0$ segments includes steps of:

creating priority (STR) and non-priority (SNTR) tables of segments, testing whether the STR table is not empty, and in this case processing as a priority the priority segments, removed from the STR table.

The step of formatting the data also includes, in a preferred embodiment the invention, steps of:

adding bits at the end of the sequence $\underline{u}$ formed by the segment packets PS chosen, so as to form a sequence of length [L], transforming the sequence $\underline{u}$ into a matrix U of M rows and $N_0$ columns, adding CRC bits at the end of each column, allocating columns.

In a preferred embodiment, the external coding (CRC) allows return to zero of the states of the turbodecoder, which affords better decoding.

In yet another aspect, the invention also relates to a method of receiving information packets P'i for a communication system having a sending part and a receiving part, connected by a noisy channel, characterised in that the reception of information packets P'i comprises the following steps:

reception on the transmission and demodulation channel, turbodecoding by means of a turbodecoder with an interleaver of the type "x to $x^e$", row column de-interleaving supplying data $c'_j$ (x), formatting of information packets P'i, from these data $c'_j$ (x).

The invention also relates to a network, a computer, a video camera, a facsimile machine, a photographic apparatus, a television receiver, a printer, a scanner and an audio/video player, characterised in that they have a device succinctly disclosed above.

The invention also relates to:

an information storage means which can be read by a computer or a microprocessor storing instructions of a computer program characterised in that it makes it possible to implement the method of the invention as succinctly disclosed above, and an information storage means which is removable, partially or totally, which can be read by a computer or a microprocessor storing instructions of a computer program characterised in that it makes it possible to implement the method of the invention as succinctly disclosed above.

The advantages of this device, of this network, of this computer, of this video camera, of this facsimile machine, of this photographic apparatus, of this television receiver, of this printer, of this scanner, of this audio-video player, and of these storage means being the same as those of the method as succinctly disclosed above, they are not repeated here.

BRIEF DESCRIPTION OF THE DRAWINGS

The description and drawings which follow will give a better understanding of the aims and the advantages of the invention. It is clear that this description is given by way of example, and has no limitative character. In the drawings.

DETAILED DESCRIPTION OF THE PREFERRED EMBODIMENTS

Figure 1:
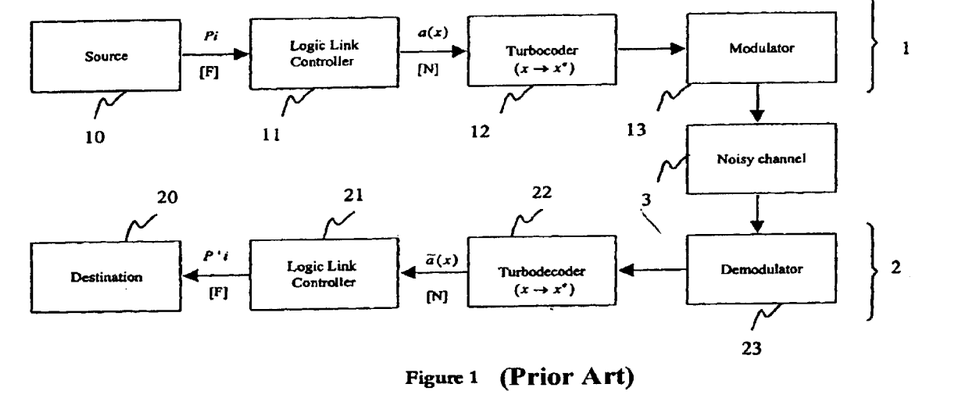
FIG. 1 is a diagram of a communication system using turbocodes with an "x to $x^e$" interleaver.

FIG. 1 illustrates a communication system using a turbocoder with an "x to $x^e$" interleaver. This communication system has a transmission part 1 and a reception part 2, connected by a transmission channel 3, possibly noisy.

The transmission part 1 has a source 10, which supplies, to a logic link controller 11, information packets Pi, with which there are associated parameters (ACK, NOACK, QOS . . . ) for the service quality required of the logic link controller 11. The logic link controller 11 supplies a binary information sequence $\underline{a}$ to a turbocoder 12.

At the output from the turbocoder 12, the signal is transmitted to a modulator 13 of a conventional type, which sends the signal over the transmission channel 3.

In the reception part 2, the operations which have the reverse of the transmission are performed, with the demodulator 23 transmitting a signal ($x'_k$, $y'_{1k}$, $y'_{2k}$) to a turbodecoder 22, which supplies at its output a sequence $\underline{a}$ to a logic link controller 21, finally supplying the information packets P'i to a destination 20.

The invention is organised around a clever use of the specific characteristics of the turbocoder 12 with the "x to $x^e$" interleaver.

Figure 2:
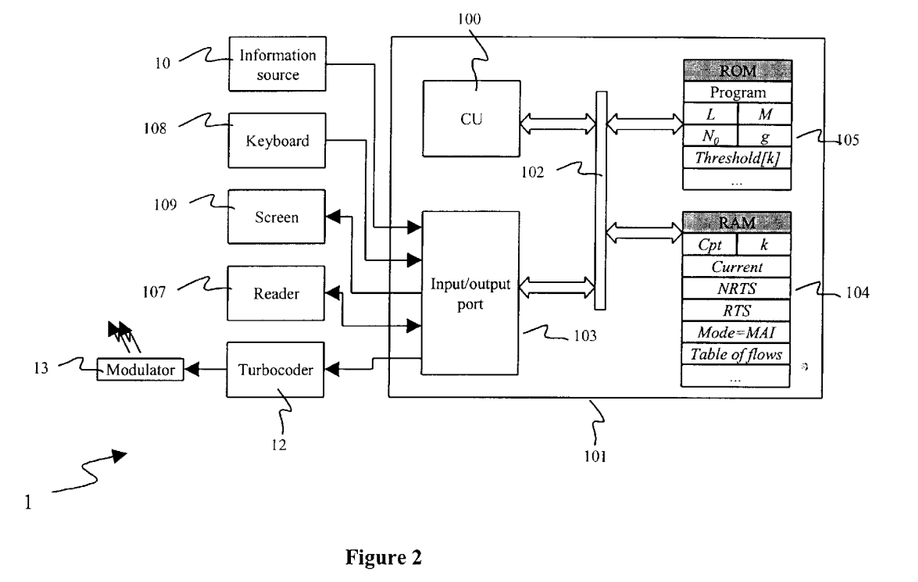
FIG. 2 is a block diagram of a transmitter implementing the invention.
Figure 3:
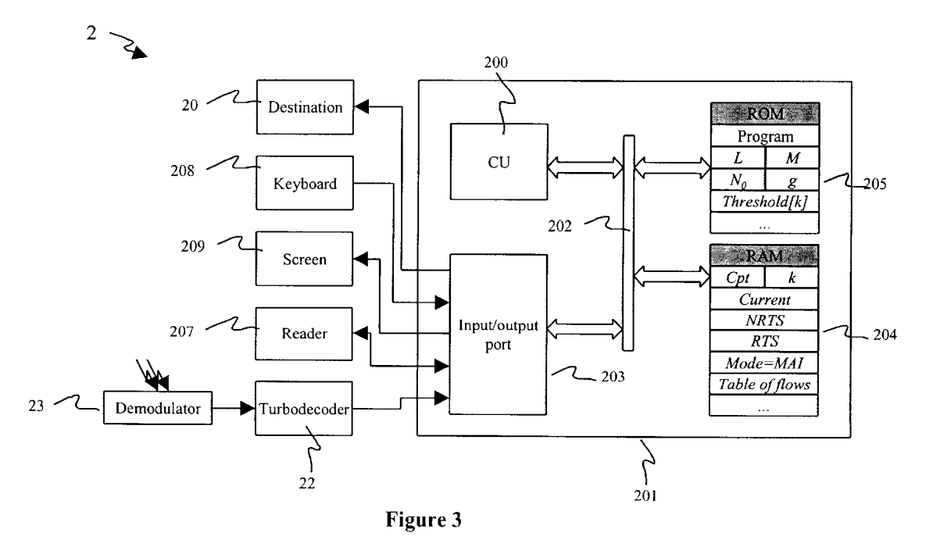
FIG. 3 is a block diagram of a receiver implementing the invention.

FIG. 2 illustrates schematically an example of a constitution of the transmission part 1, in the form of a block diagram. FIG. 3 illustrates in a similar fashion the block diagram of the reception part 2.

In the example described here non-limitatively, the transmission part 1 (or respectively the reception part 2) has a reader 107 (respectively 207), a keyboard 108 (respectively 208), a screen 109 (respectively 209), the external information source 10 (respectively the destination 20), the turbocoder 12 connected to the modulator 13 (respectively the turbodecoder 22 connected to the demodulator 23), conjointly connected to an input/output port 103 (respectively 203) of a processing card 101 (respectively 201) supporting the logic link controller 11 (respectively 21).

The processing card 101 (respectively 201) has, in the present example, connected together by an address and data bus 102 (respectively 202):

a central processing unit 100 (respectively 200);
a random access memory RAM 104 (respectively 204);
a read only memory ROM 105 (respectively 205);
an input/output port 103 (respectively 203).

Each of the elements illustrated in FIGS. 2 and 3 is well known to persons skilled in the art of microcomputers and transmission systems and, more generally, information processing systems. These common elements are therefore not described here. It should be noted, however, that:

the information source 10 is, for example, an interface peripheral, a sensor, a demodulator, an external memory or another information processing system (not shown), and is preferably adapted to supply sequences of signals representing speech, service messages or multimedia data, in the form of sequences of binary data, the modulator 13 and demodulator 23 are adapted to implement a packet transmission protocol on a wireless channel, and to transmit these packets over such a channel 3.

It should also be noted that the word "register" used in the description designates, in each of the memories 104, 204 and 105, 205, both a memory area of low capacity (a few binary data) and a memory area of large capacity (enabling an entire program to be stored).

The random access memory 104 (or respectively 204) stores data, variables and intermediate processing results, in memory registers varying, in the description, the same names as the data whose values they store. The random access memory 104 (or respectively 204) contains notably:

a register "Cpt" in which there is stored a counter which changes inversely as the number of segments sent,
a register "k" which stores an integer number which is a function of the number of transmissions of the same segment,
a register "Current" in which there are stored the segments currently being transmitted,
a register "NRTS" in which there are stored the "non-real time" (non-priority) segments,
a register "RTS" in which there are stored the "real time" segments (to be transmitted with priority),
a register "Mode=MAI" in which there is stored the operating mode (MAI or SAI) of the logic link controller 11 (or respectively 21),
a register "table of flows" containing the parameters necessary for the functioning of the ARQ method.

According to one variant, the random access memory 104 (or respectively 204) is removable, partially or totally, and comprises, for example, a magnetic tape, a diskette or a rewritable compact disc.

The read only memory 105 (or respectively 205) is adapted to store notably, in registers which, for convenience, have the same names as the data which they store:

the operating program of the central processing unit 100 (or respectively 200), in a register "program",
the value of L, in a register "L",
the value of M, in a register "M",
the value of $N_0$, in a register "$N_0$",
the sequence g, in a register "g",
the values of Threshold[k], in a register "Threshold[k]"

The central processing unit 100 (or respectively 200) is adapted to implement the flow diagram described in FIG. 2.

Logic Link Controller 11

Disposed upstream of the turbocoder 12, the purpose of the logic link controller 11 is to offer a means for the reliable transmission of information packets Pi which are sent to it by the source 10 (of a conventional type) as a function of the required service quality.

It transmits to the turbocoder 12 a sequence $\underline{a}$ obtained from the information packets Pi, this sequence a being formatted correctly in order to be processed by this turbocoder 12, using the particular characteristics of the "x to $x^e$" interleavers.

In the remainder of the description, use will be made indifferently, in order to represent the binary sequence $\underline{a}$, of the form $\underline{a}=(a_0, a_1, \ldots, a_{N-1})$, the matrix A, or the associated polynomial form:

$$a(x) = a_0 x^0 + a_1 x^1 + \ldots + a_{N-1} x^{N-1} = \sum_{i=0}^{N-1} a_i x^i$$

Figure 6:
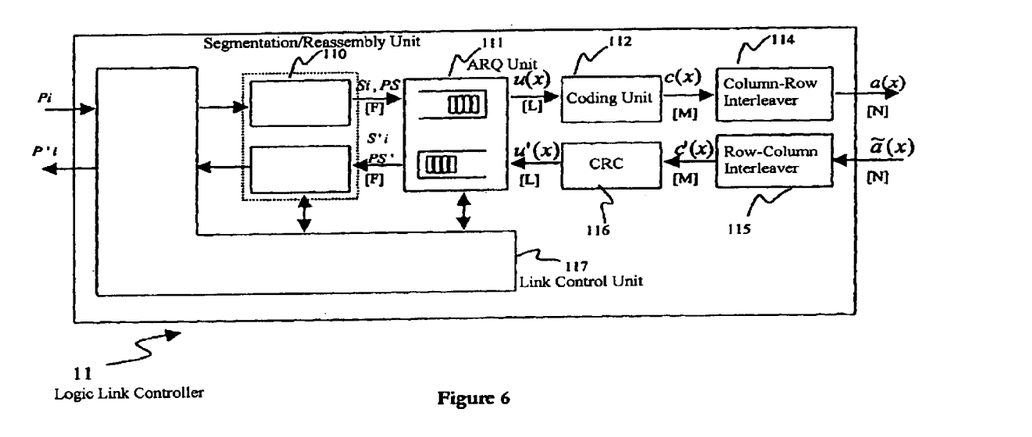
FIG. 6 is a functional diagram of a logic link controller.

The structure of this logic link controller 11 (21) is depicted schematically in FIG. 6.

It has successively, in the sending part, a link control unit 117, a segmentation/reassembly unit 110, an ARQ unit 111, a coding unit 112, and a column-row interleaver 114.

The logic link controller 11 according to the invention also functions in reception mode. For this purpose it has a row-column interleaver 115 placed upstream of a decoding module of the CRC 116, upstream of the ARQ unit 111, and of the segmentation/reassembly unit 110.

The link control unit 117 is interfaced with the segmentation/reassembly unit 110 and the ARQ unit 111.

The different modules making up the logic link controller 11 will now be detailed one after the other in the remainder of the disclosure.

The Link Control Unit 117

The link control unit 117 is a supervision module. It receives, from the source 10 the information packets Pi to be transmitted.

The link control unit 117 defines the ARQ strategy to be adopted by the ARQ unit 111 for a given flow, given the required service quality (defined by parameters received with the information to be transmitted).

The link control unit 117 is also responsible for the priority associated with each flow as a function of the associated service quality.

It can operate in two modes (MAI or SAI), in a fashion determined at the commissioning of the equipment or on manufacture of said equipment.

In MAI (Multiple ARQ Instances) operating mode of the ARQ unit 111, a flow number is associated with each packet Pi received, according to the session to which it belongs. This flow number is allocated at the connection establishment phase.

The data flow number is transmitted to the segmentation/reassembly unit 110 with the data packet Pi coming from the source 10.

In SAI (Single ARQ Instance) operating mode, the information packets Pi are transmitted to the segmentation/reassembly unit 110 with an identical flow number for all the information packets Pi.

In the embodiment described here by way of non-limitative example, the data flows sensitive to the delays introduced into the transportation of the information packets Pi do not use an ARQ mechanism (no retransmission), but are priority. The segments sensitive to transportation delays are referenced in a first RTS (real time segments) table of priority segments.

The data flows insensitive to the delays introduced for the transportation of the information packets Pi use an ARQ strategy of the GBN (Go Back N, see in the introduction) type. This ARQ method is in fact less complex to implement and requires less memory capacity than the ARQ strategy of the SR (Selective Repeat) type. The segments which are not sensitive to transportation delays are referenced in a second NRTS table of non-priority segments (non-real time segments).

Figure 7:
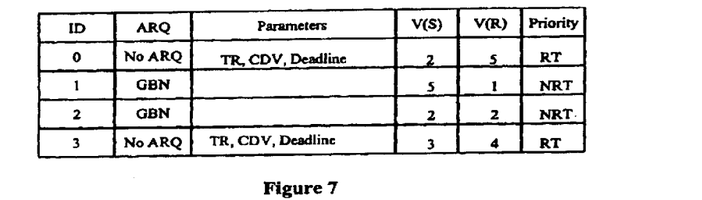
FIG. 7 depicts a table of flows in the case of functioning in MAI mode (Multiple ARQ Instances)

The link control unit 117 also keeps up to date a table of flows including parameters necessary for the functioning of the ARQ method. An example of such a flow table is illustrated in FIG. 7.

On the other hand, in SAI (Single ARQ Instance) operating mode, the information packets Pi are transmitted to the segmentation/reassembly unit 110 with an identical flow diagram. The ARQ unit 111 then uses an ARQ strategy of the SR (Selective Repeat) type. The table of flows then contains, in SAI mode, one and only one flow.

The Segmentation/reassembly Unit 110

The segmentation/reassembly unit 110 sends to the ARQ unit 111 the data flow number to which the packet Pi belongs before segmentation (coming from the source 10) with each data packet coming from the link control unit 117.

More precisely, the segmentation/reassembly unit 110 divides the packets Pi coming from the source 10 into information segments Si of fixed maximum size [F-2], a size whose value is predetermined, and depends, amongst other things, on the total size of the information packets Pi received from the source 10, and on the type of "x to $x^e$" interleaver used in the turbocoder 12.

Two bits (SH) are then added to each of these information segments Si of fixed maximum size [F-2], in the segmentation/reassembly unit 110, in order to identify whether it is a case of an information segment Si representing an isolated packet Pi (with a size less than the fixed maximum size [F-2] of the segments) or else a head information segment Si, and a tail information segment Si or an intermediate information segment Si (for a packet Pi with a size greater than [F]).

These two identification bits use the following definitions: 10=first segment, 01=last segment, 00=intermediate segment, 11=isolated segment.

Figure 8:
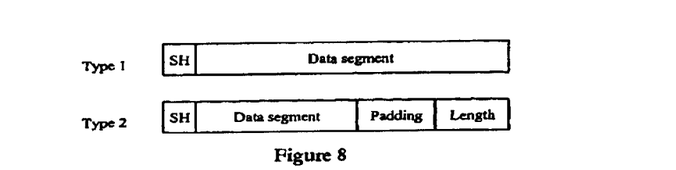
FIG. 8 depicts two types of segment packet format.

There are then created segment packets PS with a length which is always identical [F] by formatting the segments supplemented by SH bits of type 00 and 10 (intermediate segments or first segments) with a type 1 segment packet format (comprising the two bits SH and the information segment Si) illustrated by FIG. 8.

Likewise, the segments supplemented by bits SH of type 01 and 11 (isolated segments or last segments) are formatted with a type 2 segment packet format (comprising with two bits SH, the information segment Si, a length field and additional padding to attain the fixed size [F] of the segments).

The ARQ Unit 111

The output from the segmentation/reassembly unit 110, which receives from the segmentation/reassembly unit 110 segment packets PS, the ARQ unit 111 is responsible for implementing the ARQ protocol (acknowledgement protocol) which previously chosen.

As has been seen, the segments coming from the segmentation/reassembly unit 110 are managed by two distinct tables of segments to be transmitted: a first RTS table references all the segments belonging to flows having real time constraints; a second NRTS table contains all the segments belonging to flows which do not have real time constraints.

The ARQ unit 111 uses the table of flows (FIG. 7), kept up to date by the link control unit 111, in order to associate a segment with a list.

It uses a retransmission protocol based on the protocol known as HDLC. This is described briefly below.

The ARQ unit 111 sequentially numbers the ARQ packets in order to permit the detection by the receiver 2 of any error introduced by the transmission channel 3. When an error is actually detected, the ARQ unit 111 of the receiver 2 uses a retransmission strategy, which is determined by the link control unit 111, for the flow under consideration.

To implement this protocol, which uses an anticipation window, there are three categories of frame.

1/ The non-numbered frames (type U, from the English Unnumbered), are used for purposes of control. This type of frame is used for commands of the type DISC, SABM, DM and UA.

DISC (Disconnect) enables a station to announce that it is going to interrupt its communication SABM (Set Asynchronous Balanced Mode) initialises the connection between the transmitter 1 and receiver 2.

DM (Disconnected Mode) indicates that the connection is interrupted.

UA (Unnumbered Acknowledgement) acknowledges the unnumbered frames.

2/ The information frames (type 1) contain the user data and the number of the last frame acknowledged.

3/ The supervision frames (type S) for the purpose of regulating the transmitted information frames. The different kinds of supervision frames (S) are RR, REJ, RNR, SREJ.

RR (Receive Ready) indicates the next frame awaited

REJ (Reject) indicates that a transmission error has been detected. A field N(R) then contains the number of the first incorrectly received frame.

RNR (Receive Not Ready) requests the transmitter 1 to suspend transmission of the information frame (I) and acknowledges all the frames received up to N(R)-1. The receiver 2 cancels the suspension of the transmission by sending a supervision frame other than RNR.

SREJ (Selective Reject) requests the retransmission of a specific information frame (I).

The information (I) and supervision (S) frames use, for the correct functioning of the protocol, sequence numbers N(S) and N(R).

N(S) is the transmission sequence number. When the transmitter 1 sends an information frame (I) for the first time, it allocates to it a sequence number N(S) equal to the normal value of a transmission state variable V(S)

N(R) is the reception sequence number. N(R) contains the transmission sequence number of the next information frame (I) awaited by the receiver 2. When a frame is designated for transmission, its field N(R) is equal to the normal value of a reception state variable V(R).

In order to be able to manage the different fields containing sequence numbers, the system uses state variables defined as follows:

V(S): transmission state variable. V(S) represents the sequence number of the next information frame (I) which will be transmitted. V(S) is incremented by 1 at the end of the first transmission of each information frame (I). On reception of a frame SREJ (Selective Reject), V(S) takes the value of the field N(R) contained in the frame SREJ.

V(R): Reception state variable. V(R) contains the transmission sequence number of the next information packet which the receiver 2 awaits. The value of V(R) is incremented by one on reception of an information frame (I) received without error and whose transmission sequence number N(S) is equal to the normal value of V(R). (See FIG. 7)

A bit P/F (Poll/Final) is used for obliging the receiver 2 to send a supervision frame (acknowledgement RR) immediately rather than awaiting an acknowledgement conveyed by an information frame (I).

A header is therefore added in the ARQ unit 111 at each segment packet PS, thus forming an ARQ packet, to enable the retransmission protocol to be implemented.

Figure 9:
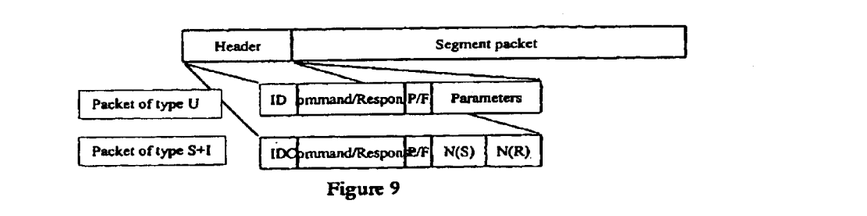
FIG. 9 shows the format of an ARQ packet.

As can be seen in FIG. 9, this header contains a field ID, which makes it possible to identify the ARQ instance (that is to say the data flow) to which this ARQ packet belongs. The control frames (U), the supervision frames (S) and the sequence numbers of the information frames (I) are managed independently for each flow.

When the link is established (for a given flow in MAI mode) between a transmitter 1 and a receiver 2, supplementary information (parameters) relating to this connection, such as for example the quality of service parameters (QoS) or the associated free transmission strategy, are added.

In an ARQ packet of type U, this header comprises the field ID, a command/response field, a field P/F, and the connection parameters.

In an ARQ packet of type S+I, this header comprises the field ID, a command/response field, a field P/F, and two fields N(S) and N(R).

In the ARQ unit 111, two operating modes can be implemented for the acknowledgement protocol (ARQ method). Either a single ARQ instance is created (SAI method), or an ARQ instance is used for each communication (multiple flows, MAI method).

1/ In the MAI method (Multiple ARQ Instances), the means necessary for the functioning of a basic ARQ protocol (FIG. 30) are associated with each information flow (instance or connection). Each ARQ packet (FIG. 9) therefore has a flow number which makes it possible to identify its source and a sequence number N(S) in this source.

2/ In the SAI (Single ARQ Instance) mode, there is a single flow and the sequence numbers N(S) are allocated sequentially to the segment packets PS in their order of allocation to the columns of the interleaver 121 of the turbocoder 12, without indicating their origin. The ARQ protocol implemented is in this case independent of the source 10 (FIG. 11).

The ARQ unit 111 supplies as an output, to the coding unit of the CRC 112, a sequence $\underline{u}=(u_0, u_1, \ldots, U_{R-1})$ (or u(x) in a polynomial form or U in equivalent matrix form), of length [L], composed from segment packets PS, to which headers are added.

Figure 10:
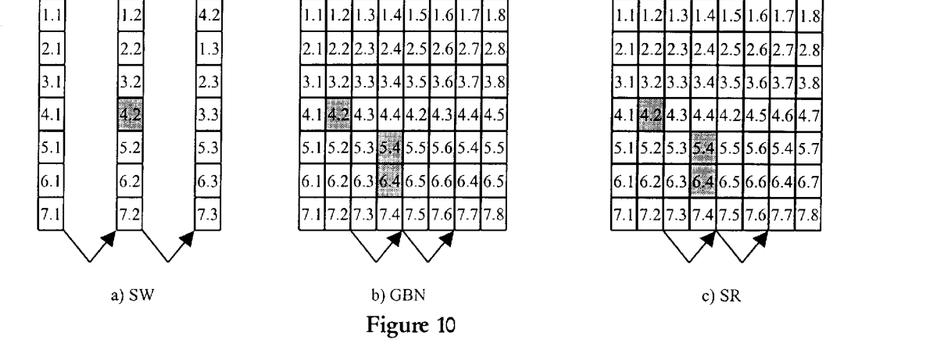
FIG. 10 describes the MAI operating mode with No=7.
Figure 11:
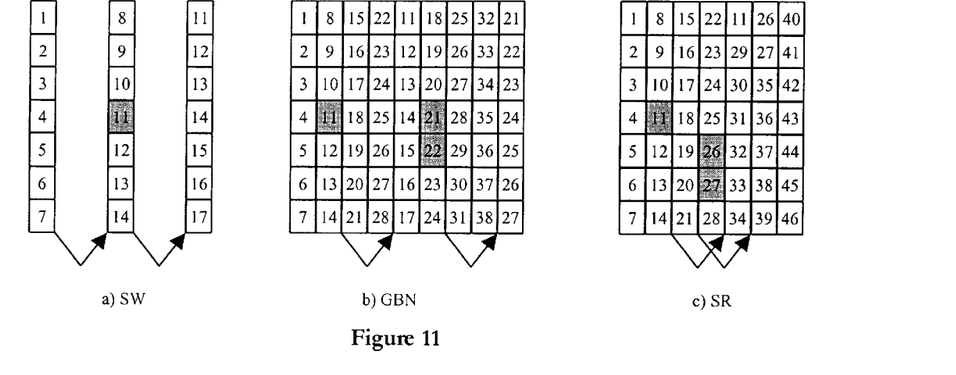
FIG. 11 describes an SAI operating mode (single ARQ instance) with No=7.

The transmission of the ARQ packets to the coding unit of the CRC 112 then takes place in accordance with the procedure described in FIGS. 10 and 11.

In summary, $N_0$ segments are sent into the coding unit of the CRC 112 in order to form a matrix A equivalent to a polynomial a(x) at the input of the turbocoder 12 (normal transmission). The choice of the $N_0$ segments is a function of the priority associated with each flow, the signal to noise ratio (SNR) of the transmission channel, the retransmissions to be made and the number of segments available for transmission.

Since the real-time flows (RTS table) do not use a retransmission mechanism, each segment can be recopied several times in the same transmission, with the same sequence number as a function of the signal to noise ratio on the transmission channel.

Figure 12:
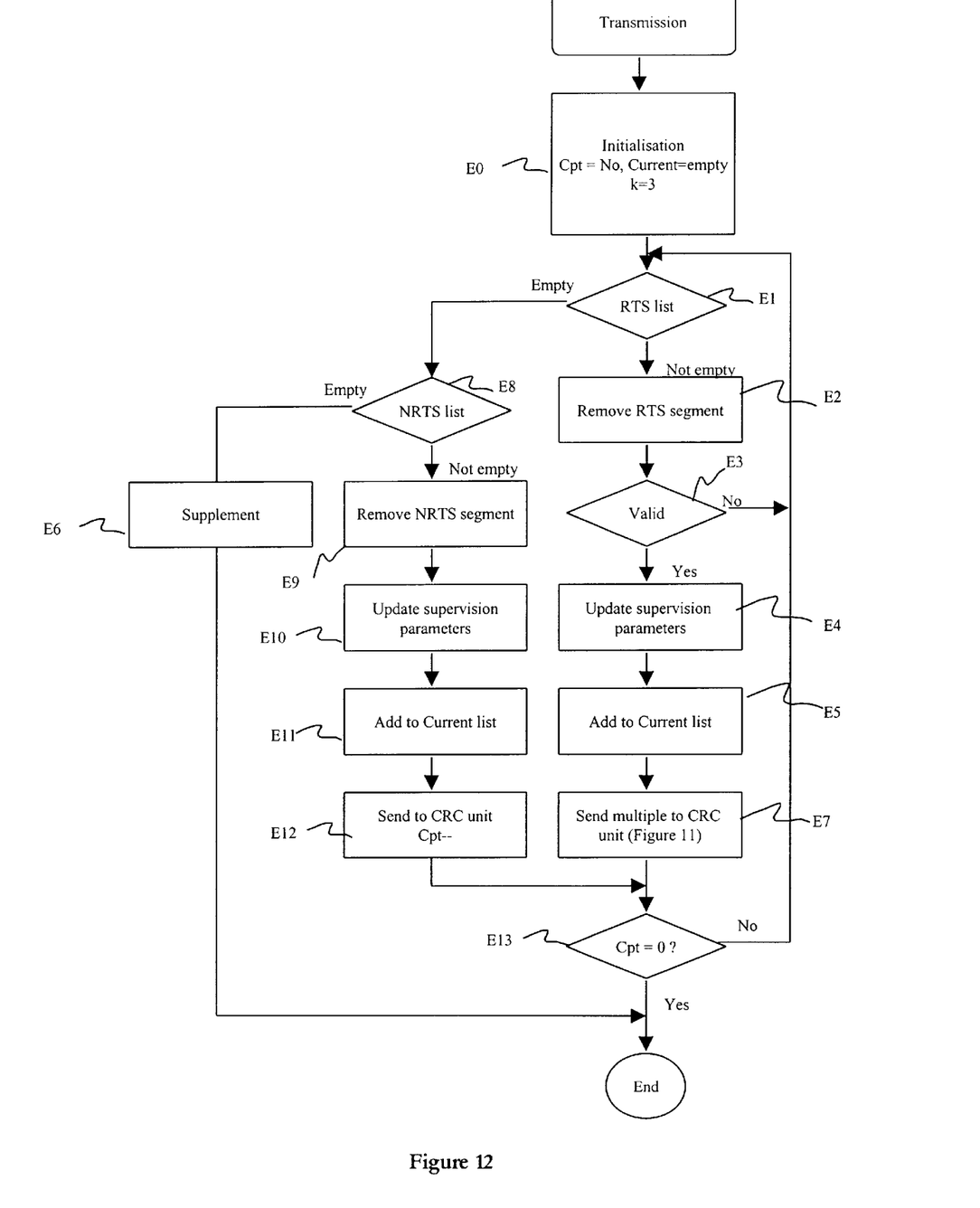
FIG. 12 is a flow diagram of the general principle of the sending of $N_0$ segments to the coding unit of the CRC 112.

FIG. 12 is a flow diagram of the general principle of the transmission of $N_0$ segments to the coding unit of the CRC 112 in order to form the polynomial a(x) at the output of the logic link controller 11.

During transmission, working variables are initialised (a counter Cpt initialised to the predetermined value $N_0$, an integer k initialised to 3, an initially empty Current assembly) (step E0).

It is found that, if the RTS table is not empty, the priority segments removed from the RTS table (steps E1 and E2) are processed as a priority.

A validity test for this type of segment is performed (step E3) in order not to send segments whose validity date (which is one of the possible service quality parameters) is exceeded. The supervision parameters are then updated (step E4).

The list of the $N_0$ segments used for the current transmission is stored in a table called Current (step E5).

This list is used subsequently in order to obtain the $N_0$ segments necessary (step E6) to a transmission where the RTS and NRTS tables do not reference $N_0$ segments.

Figure 13:
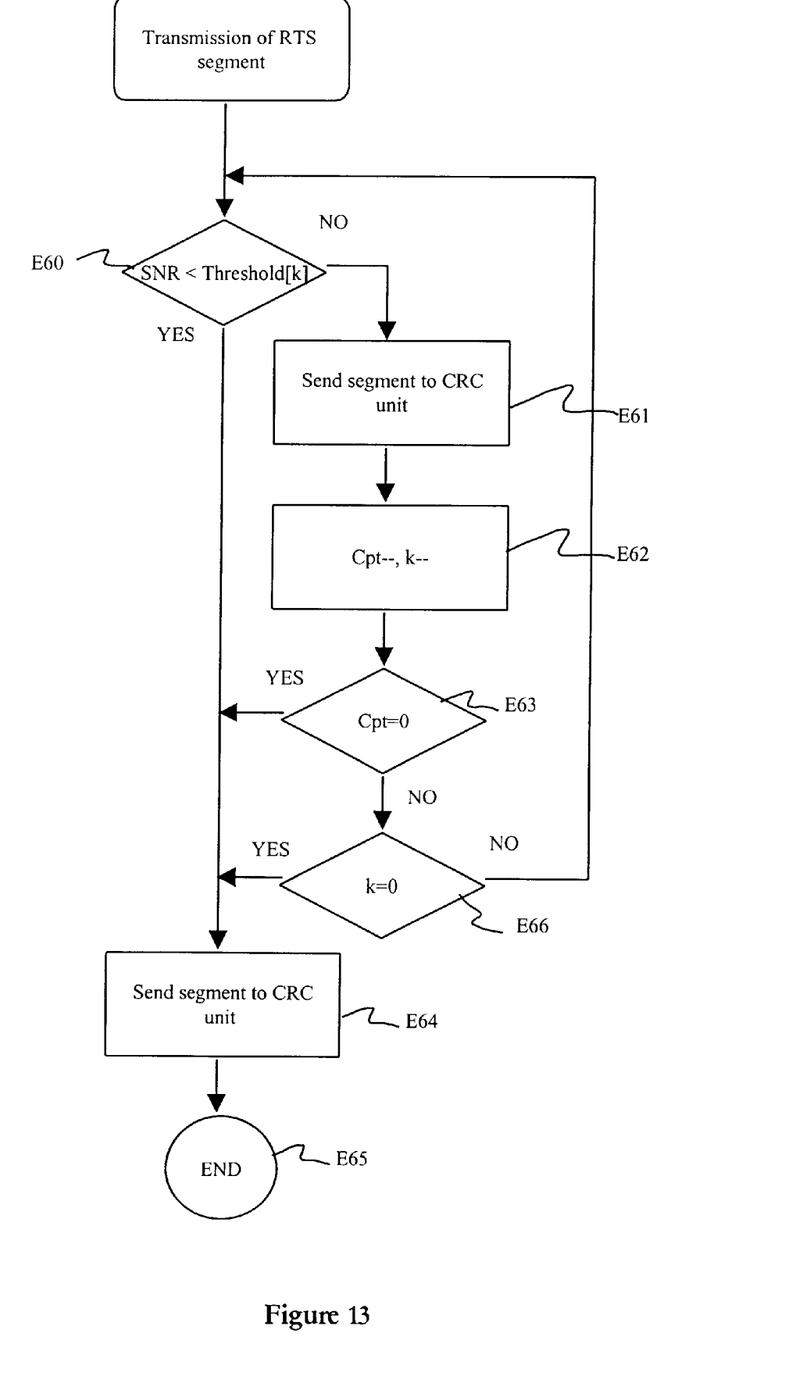
FIG. 13 illustrates a detail of the same flow diagram.

The step entitled "multiple sending to the CRC unit" (step E7) is detailed in FIG. 13. It concerns the multiple sending of a priority segment TR from the RTS table to the coding unit of the CRC 112. In this case, three levels of the signal to noise ratio (SNR) are considered, characterised by predetermined thresholds (Threshold[k], for k from 1 to 3), which can then give rise to up to four sendings of one and the same segment to the coding unit of the CRC 112.

This is because a first test (step E60) of the signal to noise ratio higher than a first threshold Threshold[3] is performed. If the signal to noise ratio SNR is higher than the first threshold, the current segment is transmitted to the coding unit of the CRC, and this function is exited (steps E64, E65).

On the other hand, if the signal to noise ratio SNR is below said first threshold (a great deal of noise on the transmission channel), the segment is sent to the coding unit of the CRC 112 (step E61), and the counter Cpt and the integer k are decremented (step E62).

If the counter Cpt arrives at zero (step E63), this means that $N_0 -1$ segments have been recovered for transmission, the current segment is sent to the CRC unit (step E64) and the function is exited (step E65).

If the counter Cpt is not yet at zero (fewer than $N_0 -1$ segments sent), but the integer k characterising the signal to noise ratio thresholds for its part has arrived at zero (step E66), this means that the segment has already been transmitted three times, the current segment is sent once again to the CRC unit (step E64) and the function is exited (step E55).

When a segment has passed several times to the coding unit of the CRC unit 112, which amounts to making several copies of it, its sequence number is identical for all the copies.

It should be noted that a sequence number is allocated to the segments of a real-time flow (RT in FIG. 7), although no retransmission mechanism is applied, this is done in order to prevent any duplication on reception because of the copies in transmission. Thus, for several copies in transmission, a single copy in reception will be passed to the reassembly unit 110.

Returning now to FIG. 12, it will be noted that, when the table of priority segments RTS is empty (step E1), the table NRTS of non-priority segments is passed to (step E8). The segments are withdrawn one by one from the table NRTS (step E9), the supervision parameters are updated (step E10), the segment is added to the list Current (step E11), and then sent to the coding unit of the CRC 12 (step E12), whilst the counter Cpt is decremented.

As long as the counter Cpt has not arrived at zero ($N_0$ segments sent to the coding unit of the CRC (step E13), the ARQ unit returns to seek the segments to be transmitted first of all in the table RTS, and then in the table NRTS, and finally, failing that, in the list Current, in order to complete a group of $N_0$ segments to be sent.

The Coding Unit of the CRC 112

The coding unit of the CRC 112 (CRC meaning Cyclic Redundancy Check) then effects a particular formatting of the data with a view to their future use by the turbocoder 12.

It was seen above that the logic link controller 11 supplies to the turbocoder 12 a sequence of binary information $\underline{a}=(a_0, a_1, \ldots, a_{N-1})$, of length $[N]=[N_0] * [M]$, representing the packets of information Pi supplied by the source 10.

In order to be in a suitable form for the remainder of the processing by turbocoding, it is necessary to ensure the divisibility of the polynomial $a(x)$ (equivalent to the supplied binary sequence $\underline{a}$) issuing from the logic link controller 11, by a polynomial $g(x)$ referred to as the feedback polynomial of the turbocoder 12, previously chosen.

To do this, it is necessary for the binary sequence $\underline{a}$ issuing from the logic link controller 11 to satisfy a length condition, and the sequence $\underline{u}$ issuing from the ARQ unit 111 is consequently extended in the coding unit of the CRC 112 by adding the number of bits necessary to satisfy said length condition.

The sequence a must meet the condition of having a number of binary data (denoted [N]) equal to the product of any integer number M by an integer $N_0$, the smallest integer such that $1+x^{No}$ is divisible by the polynomial $g(x)$.

The sequence $\underline{a}$ can, in this case, be organised in a table A of M rows and $N_0$ columns, the weights of the binary elements being organised in increasing order on the rows.

Figure 14:
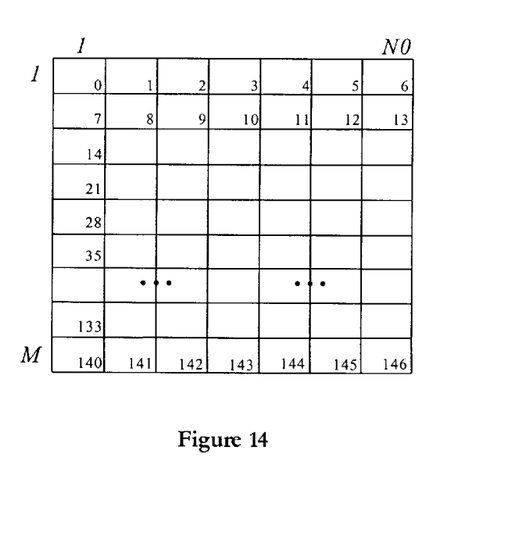
FIG. 14 illustrates the organisation of the binary sequence $\underline{a}$ in a matrix or No=7 and M=21.

FIG. 14 gives an example of an organisation of a binary sequence $\underline{a}$ in a matrix A for example $N_0=7$, $M=21$ and $g(x)=1+x+x^3$ (it should be noted that $1+x+x^3$ does indeed divide $1+x^7$).

Figure 15:
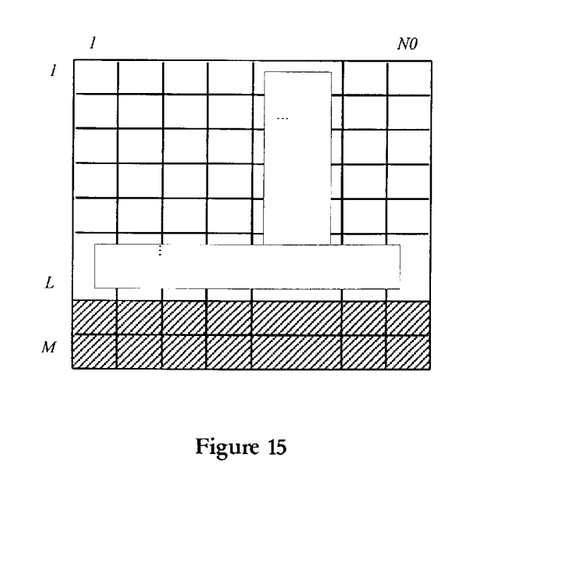
FIG. 15 represents the coding of the CRC (Cyclic Redundancy Check).

In the CRC coding unit 112 used for the purpose of detection, for each column (in the matrix A corresponding to the sequence $\underline{a}$) a certain number of bits are added, at the bottom of each column (one CRC per column), in order to detect whether the column is in error (FIG. 15).

Let then (M, L) be the CRC error detection code (cyclic check code by redundancy) applied to each column.

The matrix form of the binary sequence $\underline{a}$ then makes it possible to write:

$$a(x) = \sum_{j=0}^{N0-1} \sum_{i=0}^{M-1} a_{iN0+j} x^{iN0+j}$$

If there is written $$c(x) = \sum_{i=0}^{M-1} a_{iN0+j} x^i$$

the polynomial corresponding to the column J.

and $$d(x) = \sum_{j=0}^{N0-1} a_{iN0+j} x^{ji}$$

the polynomial corresponding to the row i, $a(x)$ can also be written:

$$a(x) = \sum_{j=0}^{N0-1} c_j(x^{No}) \cdot x^j = \sum_{i=0}^{M-1} d_i(x) \cdot x^{iN0}$$

If $y=x^{No}$, then $$a(x) = \sum_{j=0}^{N0-1} c_j(y) \cdot x^j$$

On reception each column received can then be expressed by $$p_j(y)=c_j(y)+e_j(y)$$

where $e_j(y)$ is the error polynomial on the column j.

If it is assumed that there are w pairs of errors at positions $p_1, p_2, \ldots, p_w$, the polynomial $e_j(y)$ can be written:

$$ej(y)=y^{p1}(1+y)+y^{p2}(1+y)+\ldots+y^{pw}(1+y)=(1+y).e'_j(y)$$

where the polynomial $e'_j(y)$ represents the singular errors (single errors) on the column j.

It should be noted that the division of each column by $(1+y)$ divides the number of errors by two, reducing all the pairs of errors into singular errors).

One bit is therefore reserved on each column in order to ensure divisibility by $(1+y)$. This bit also allows the detection of an odd number of errors, but it is insufficient in this precise case of pairs of errors.

In order to increase the detection capacity of the coding unit (of the CRC 112), four additional bits are added to each column using the generator polynomial: $1+y+y^4$.

Finally, there is applied to each column the code (M=L+5, L) having as a generator polynomial: $g_1(y)=(1+y)(1+y+y^4)$.

It has been seen that $$a(x) = \sum_{j=0}^{NO-1} c_j(y) \cdot x^j$$

with $y=x^{No}$.

In order to ensure, as explained above, that a(x) is divisible by g(x) it suffices for $c_j(y)$ to be divisible by g(x). According to the construction of the code (M, L), $c_j$ (y) is divisible by (1+y) and therefore by $(1+x^{No})$, or by hypothesis g(x) divides $(1+x^{No})$, and consequently $c_j$ (y).

In summary, the fact that each column is divisible by (1+y) ensures that the polynomial a(x) is divisible by g(x).

It will thus be understood that the problem of the return to zero of the states of the turbodecoder 22 is ensured by the design of the coding unit of the CRC 112 which verifies the divisibility of the polynomial a(x) by g(x).

The Column-row Interleaver 114

In a known fashion, the column-row interleaver 114 is an interleaver in which writing takes place on the rows, and reading on the columns.

The Turbocoder 12

The turbocoder 12, which receives the sequences a, of length [N], supplied by the logic link controller 11, is a module using a known turbocode technique.

Figure 4:
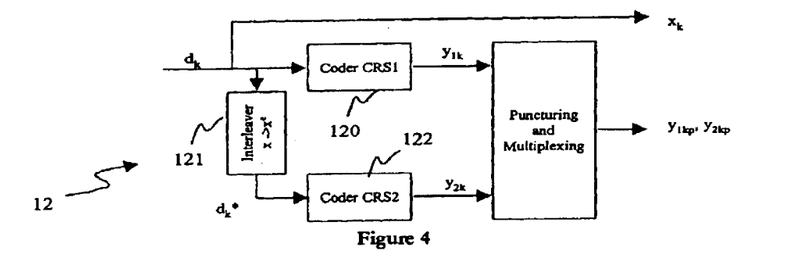
FIG. 4 is a functional diagram of a turbocoder.

Fundamentally, the turbocodes are a parallel concatenation of systematic recursive convolutional codes (SRC) on the principle depicted in FIG. 4 (see for example: Near Optimum error-correcting coding and decoding: turbo codes, Berrou, Glavieux, IEEE Transactions on Communications, Oct. 1996).

In the turbocoder 12, an incoming information sequence $\{d_k\}$ is applied simultaneously to the input of a first coder 120 SRC1 and, via an "x to $x^e$" interleaver 121, to the input of a second coder 122 SRC2.

At the output of the turbocoder 12, the data $X_k=a_k$ of the information sequence a, are multiplexed before transmission with the first and second redundant sequences $Y_{1k}$ and $Y_{2k}$ issuing respectively from the first and second coders 120 SRC1 and 122 CRS1.

In a variant embodiment, the redundant sequences $y_{1k}$ and $y_{2k}$ are punctured (according to a technique known per se) in order to obtain a variable coding $y_{1kp}, y_{2kp}$.

The "x to $x^e$" Interleavers 121

As is clear from the above account, the choice of "x to $x^e$" interleavers 121 is an important element in the device. The bit error rates and the distribution of the residual errors at the output of the turbodecoder 22 depend greatly on this interleaver 121.

Interleavers of the type "x to $x^e$", as defined above, are used by the present invention, in the turbocoder 12 and turbodecoder 22.

It should be stated here that the manner of interleaving the data with an interleaver of the "x to $x^e$" type means that the residual errors have a particular form, they occur in pairs, on one or more columns according to the signal to noise ratio.

As has been seen, the data $(x_k, y_{1k}, y_{2k})$ issuing from the turbocoder 12 are sent to a modulator 13 of a conventional type, which sends this signal over a transmission channel 3 of a conventional type, possibly noisy and therefore introducing errors into the signal received.

Reception Part 2

It should be stated that, in the reception part 2, the reverse operations to transmission are performed, with the demodulator 23 transmitting a signal $(x'_k, y'_{1k}, y'_{2k})$ to the turbodecoder 22, which supplies as an output a sequence ã sequence a to the logic link controller 21, finally supplying the information packets P'i to the destination 20.

Figure 5:
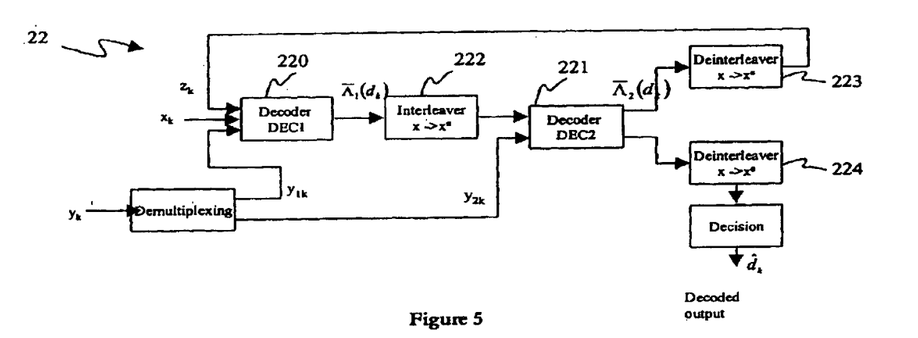
FIG. 5 is a functional diagram of a turbodecoder.

With regard to the turbodecoder 22, the decoding of two codes concatenated in parallel can be effected using a first decoder 220 DEC1 and a second decoder 222 DEC2 associated according to the principle of the iterative decoder depicted in FIG. 5.

The decoder 220 DEC1 uses three items of information:

1/, 2/ the data of the information sequence $x'_k$ and the first redundant sequence $Y'_{1k}$ coming from the demodulator 23, and 3/ extrinsic information $z'_k$ coming from the second decoder 221 DEC2 via a deinterleaver 223 of a conventional type, in order to calculate a likelihood ratio logarithm (LRL) $\Lambda_1(d_k)$, which is also written:

$$\Lambda_1(d_k) = \log \frac{Pr\{(d_k = 1)/\text{observation}\}}{Pr\{(d_k = 0)/\text{observation}\}},$$

where Pr{a} represents the probability of the event {a}.

This likelihood ratio logarithm LRL is obtained by means of the decoder 220 DEC1 according to a method (known per se) of maximum a posteriori likelihood. It can as a variant be obtained by means of a modified Viterbi decoder.

The second decoder 221 DEC2 uses two items of information:

1/ second redundant sequence $y'_{2k}$ coming from the demodulator 23, and

2/ the likelihood ratio logarithm (LRL) $\Lambda_1(d_k)$ issuing from the first decoder 220 DEC1 and passed through an "x to $x^e$" interleaver 222.

There is obtained, at the output of this second decoder 221 DEC2, a likelihood ratio logarithm LRL $\Lambda_2(d_k)$, which, after deinterleaving by means of a interleaver 224, also of a type known per se, supplies an estimation $\tilde{a}$ (=$\{\tilde{a}_k\}$) the initially transmitted sequence a (=$\{a_k\}$).

In the reception part, the purpose of a second logic link controller 21 is to offer a means of reliable transmission of the information segments which are sent to it to the destination 20 according to the required service quality. It has a structure identical to that of a first logic link controller 11 of the transmission part (1).

It has, in succession, a row-column interleaver 115 placed upstream of a decoding module of the CRC 116, upstream of an ARQ unit 111, and of a segmentation/reassembly unit 110.

Here, like the logic link controller 11 of the transmission part 1, a link control unit 117 is interfaced with the segmentation/reassembly unit 110 and the ARQ unit 111.

The row-column interleaver 115 is, as known per se, an interleaver in which writing is carried out on the columns, and reading on the rows. It supplies data $c'_j(x)$ to the decoding unit of the CRC 116 from data ã (x) received from the turbodecoder 22.

The decoding unit of the CRC 111 uses the same generator polynomial $g_1(y)=(1+y)(1+y+y^4)$ as in the coder in order to perform the decoding function.

The ARQ unit 111 effects, on reception, the sequencing of the segment packets PS' sent to the reassembly module of the segmentation/reassembly unit 110. In this ARQ unit 111, a header of predetermined size is removed from each ARQ packet, in order to form segment packets PS'.

In reverse to that which was performed by the segmentation unit 110 in the transmission part, the reassembly module of the segmentation/reassembly unit 110 removes two bits SH from each of the segment packets PS' in order to form segments S'i (elimination of the "padding").

The segments S'i are finally reassembled as packets P'i (with a length possibly greater than [F]) by the segmentation/reassembly unit 110 before being sent to the upper layers (destination 20) for processing, in the form of packets P'i.

It will be understood that the reception of information packets P'i comprises (in a manner corresponding to the transmission part) the following steps:

reception on the transmission channel 3 and demodulation in the demodulator 23,     turbodecoding by the turbodecoder 22 with an interleaver of the "x to $x^e$" type, supplying data $\tilde{a}$ (x),     row-column deinterleaving of the data $\tilde{a}$ (x) in the row-column interleaver 115, supplying data $c'_j(x)$,     formatting (in the decoding unit of the CRC 116, the ARQ unit 111 and the reassembly module of the segmentation/reassembly unit 110) of packets of information P'i (sent to the destination 20), from these data $c'_j(x)$, including substeps of:

removing CRC bits at the end of each column $c'_j(x)$ (in the decoding unit of the CRC 116), thus forming a matrix U',         transforming the matrix U' with M rows and $N_0$ columns into a sequence u',         removing bits at the end of the sequence $\underline{u}'$ of length [L], so as to form a sequence of ARQ packets (in the ARQ unit 111),         transforming ARQ packets having an ARQ instance identifier into separate packets PS of predetermined fixed length (in the ARQ unit 111),         extracting information segments S'i from the segment packets PS and assembling information segments S'i with a fixed maximum length in information packets P'i (in the segmentation/reassembly unit 110).

In summary, the information supplied by the source 10 is divided into blocks of predetermined size to which an external coding is applied in order to detect any residual errors present at the output of the turbodecoder 22. The segments thus coded are delivered to a column-row interleaver 114 before being sent to a turbocoder 12. The allocation of one of the segments to a column of the column-row interleaver 114 may be the subject of a particular strategy, such as, for example, the copying of a segment in several columns.

It will be understood that the invention described therefore meets the problems set out above:

it uses interleavers which are economical in memory and does not require complete retransmission of the data transmitted in the event of an error being detected,     it does not require additional redundancy as required for implementing an ECC,     the method is not limited to a low frequency,     it mitigates the residual errors after turbodecoding.

In the above description, a favoured direction (by default) is chosen for writing/reading and coding/decoding of the matrices. It is however obvious that implementing the invention remains mainly identical if, throughout the above disclosure, all the columns are changed into rows and all the rows into columns.

It is quite clear that, in more general terms, the invention in fact uses a transmission method executed vector by vector, where the concept of vector can designate both a row and a column.

It is clear that the invention applies, amongst other things, to a network, a computer, a video camera, a facsimile machine, a photographic apparatus, a television receiver, a printer, a scanner or an audio/video player.

Naturally, the present invention is not limited to the details of the embodiments described here by way of example, but on the contrary extends to any modifications within the capability of a person skilled in the art.

What is claimed is:

1. A device for transmitting information packets Pi from a source for a communication system, comprising a turbocoder and a logic link controller placed between the source and the turbocoder, the logic link controller having formatting means for formatting the information packets Pi to yield sequences of binary symbols $\underline{a}$ of a length $N=M \cdot N_0$, where $N_0$ and M are odd integers, the formatting being such that residual errors in each turbodecoded received sequence $\underline{\tilde{a}}$ will occur, when sequence $\underline{\tilde{a}}$ is written as a matrix having $N_0$ columns and M lines, in sets of symbols on one or more columns.

2. The device according to claim 1, in which the turbocoder has an interleaver of the "x to $x^e$" type.

3. The device according to claim 2, in which the formatting means comprises an external interleaver of a row column or column row type.

4. The device according to claim 1, in which the logic link controller further comprises external coding means and retransmission management means.

5. The device according to claim 4, in which the logic link controller further comprises segmentation means, and the retransmission management means comprises an ARQ unit and a link control unit interfaced with the segmentation means and the ARQ unit.

6. The device according to claim 5, in which the link control unit has means for referencing:

the flows of data sensitive to the delays introduced into the transportation of the information packets Pi in a first RTS (Real Time Segment) table of priority segments, and     the flows of data which are insensitive to the delays introduced for the transportation of information packets Pi in a second NRTS table (Non-real time segments) of non-priority segments.

7. The device according to claim 5, in which the segmentation means has means for dividing the packets Pi coming from the source into segments of predetermined fixed size, and     means for adding two identification bits SH to each of the segments, thus forming a packet PS.

8. The device according to claim 5, in which the ARQ unit has means for adding a header to each segment packet PS, thus forming an ARQ packet.

9. The device according to claim 8, in which the header contains a field ID, which makes it possible to identify the ARQ instance or the data flow to which the ARQ packet belongs.

10. The device according to claim 9, in which the ARQ unit has means for supplying, to a coding unit of a Cyclic Redundancy Check, a sequence $\underline{u}=(u_0, u_1, \ldots, u_{R-1})$, or $u(x)$ in a polynomial form or U in an equivalent matrix form, of length, composed from ARQ packets.

11. The device according to claim 4, in which the logic link controller has means for implementing two operating modes for the acknowledgement protocol, an SAI (Single ARQ Instance) method or a MAI (Multiple ARQ Instances) method.

12. The device according to claim 11, in which the ARQ unit has means for associating, in MAI mode, with each information flow, elements necessary for the functioning of a basic ARQ protocol.

13. The device according to claim 5, in which the link control unit has means for associating a flow number with each packet Pi received, according to the session to which it belongs, in an MAI operating mode.

14. The device according to any one of claims 5 to 13, in which the link control unit has means for keeping up to date a table of the flows including the parameters necessary to the functions of the ARQ method, in MAI operating mode.

15. The device according to claim 5, in which the link control unit has means for transmitting the information packets Pi to the segmentation means with an identical flow number for all the information packets Pi, in an SAI operating mode.

16. The device according to claim 5, in which the ARQ unit has means for allocating, in the SAI mode, sequence numbers N(S) sequentially to the segment packets PS in their order of allocation to the columns of the interleaver of the turbocoder, without indicating their origin.

17. A device for receiving information packets P'i for a communication system, comprising a turbodecoder and a logic link controller placed between the turbodecoder and the destination, the logic link controller having formatting means for formatting turbodecoded received sequences $\underline{\hat{a}}$ of binary symbols into information packets P'i.

18. The device according to claim 17, in which the turbodecoder has a deinterleaver of the "x to $x^e$" type.

19. The device according to claim 18, in which the formatting means comprises an external interleaver of a row column or column row type.

20. The device according to claim 17, in which the logic link controller further comprises a decoding means of a Cyclic Redundancy Check and a retransmission management means.

21. The device according to claim 20, in which the logic link controller further comprises reassembly means, and in which the retransmission management means comprises an ARQ unit and a link control unit interfaced with the reassembly means and the ARQ unit.

22. The device according to claim 21, in which the ARQ unit has means for removing a header of predetermined size, from each ARQ packet, thus forming a segment packet PS.

23. The device according to claim 21, in which the reassembly means has:
means for removing two identification bits SH from each of the packets PS, thus forming segments S'i, and
means for assembling the segments S'i in packets P'i transmitted to the destination.

24. The device according to claim 20, in which the decoding means of the CRC has means for supplying, to the ARQ unit, a sequence $\underline{u}=(u_0, u_1, \ldots, u_{R-1})$ of length.

25. The device according to claim 20, in which the logic link controller has means for implementing two operating modes for the acknowledgement protocol, an SAI (Single ARQ Instance) method or a MAI (Multiple ARQ Instances) method.

26. A method of transmitting information packets Pi for a communication system having a transmission part and a reception part, connected by a noisy channel, in which the transmission of the information packet Pi comprises the steps of:
formatting data $c_j(x)$ from information packets Pi,
column-row interleaving of the data,
turbocoding by means of a turbocoder with an interleaver of the X→$X^e$ type, and
modulating and transmitting over the transmission channel.

27. The method according to claim 26, in which said data formatting step includes the steps of:
dividing the information packets Pi into information segments Si of fixed maximum length, and
formatting into segment packets PS of predetermined fixed length.

28. The method according to claim 27, in which said data formatting step further comprises the step of transforming the segment packets PS into ARQ packets having an ARQ instance identifier.

29. The method according to one of claims 26 to 28, in which said data formatting step includes a step of choosing $N_0$ information segments (ARQ packets) to be transmitted, $N_0$ being a predetermined value.

30. The method according to claim 29, in which the choice of the $N_0$ segments is a function of:
a priority associated with each flow,
a signal to noise ratio (SNR) of the noisy channel,
retransmissions to be effected, and
a number of information segments available for transmission.

31. The method according to claim 30, in which the choice of the $N_0$ segments includes the steps of:
creating priority segment tables (RTS) and non-priority segment tables (NRTS), and
testing whether the RTS table is not empty, and in this case processing as a priority the priority segments removed from the RTS table.

32. The method according to claim 31, in which said priority segment processing step includes a validity test of the RTS segment in order not to send segments having a validity date which has passed.

33. The method according to claim 31, in which said step of processing the priority segments STIR includes a step of multiple sending of a priority segment RT of the table RTS to the coding unit of a Cyclic Redundancy Check, the number of sendings being larger according to a quality criterion of the transmission channel.

34. The method according to claim 33, in which the quality criterion of the transmission channel consists of comparing a signal to noise ratio of a transmission channel currently being used with several predetermined level thresholds.

35. The method according to claim 31, further comprising the step of, when the table RTS is empty, processing non-priority segments, removed from the table NRTS.

36. The method according to claim 35, further comprising the step of, when the two tables RTS and NRTS are empty, complementing the $N_0$ segments to be sent with a previously stored list of segments to be transmitted.

37. The method according to claim 36, in which the list of segments to be transmitted includes the list of the $N_0$ segments used for the current transmission.

38. The method according to any one of claims 24 to 29, in which said data formatting step further comprises the steps of:
adding bits at the end of a sequence formed by the ARQ packets chosen, so as to form a sequence $\underline{u}$ of length,
transforming the sequence $\underline{u}$ into a matrix $\underline{\underline{U}}$ with M rows and $N_0$ columns,
adding CRC bits at the end of each column, and
allocating columns.

39. Information storage means, readable by a computer or a microprocessor, storing instructions of a computer program, which implements the transmission method according to any one of claims 26 to 28.

40. Information storage means, removable, partially or totally, which can be read by a computer or a microprocessor, storing instructions of a computer program, which implements the transmission method according to any one of claims 26 to 28.

41. A method of receiving information packets P'i for a communication system having a transmission part and a reception part, connected by a noisy channel, in which the reception of information packets P'i comprises the steps of:

receiving on the transmission channel and demodulating, turbodecoding by a turbodecoder with an interleaver of the "x to $x^e$" type, row-column deinterleaving supplying data $c'_j(x)$, and formatting of information packets P'i, from the data $c'_j(x)$.

42. The method according to claim 41, in which said step of formatting the information packets P'i includes the steps of:

removing CRC bits at the end of each column $c'_j(x)$, thus forming a matrix $\underline{\underline{U'}}$, transforming the matrix $\underline{\underline{U'}}$ with M rows and $N_0$ columns into a sequence $\underline{u'}$, and removing bits at the end of the sequence $\underline{u'}$ of length, so as to form a sequence of ARQ packets.

43. The method according to claim 42, in which said step of formatting information packets P'i includes the step of transforming the ARQ packets having an ARQ instance identifier into segment packets PS of predetermined fixed length.

44. The method according to claim 43, in which said step of formatting the information packets P'i also includes the step of extracting information segments S'i from the segment packets PS and assembling information packets S'i of fixed maximum length in information packets P'i.

45. Information storage means, readable by a computer or a microprocessor, storing instructions of a computer program, which implements the reception method according to any one of claims 41 to 44.

46. Information storage means, removable, partially or totally, which can be read by a computer or a microprocessor, storing instructions of a computer program, which implements the reception method according to any one of claims 41 to 44.

* * * * *

UNITED STATES PATENT AND TRADEMARK OFFICE
CERTIFICATE OF CORRECTION

| | |
|---|---|
| PATENT NO. | : 6,857,096 B1 |
| APPLICATION NO. | : 09/546686 |
| DATED | : February 15, 2005 |
| INVENTOR(S) | : Mohamed Braneci et al. |

It is certified that error appears in the above-identified patent and that said Letters Patent is hereby corrected as shown below:

ON THE TITLE PAGE [56]:

Other Publications, in "Narayanan et al.," (first occurrence) "A Novel . . . Principle," should read --"A Novel . . . Principle",--.

COLUMN 1:

Line 39, "serves" should read --serve--.

COLUMN 3:

Line 1, "Naraywan" should read --Narayanan--; and
Line 4, "an" should read --a--.

COLUMN 5:

Line 4, "characterised" should read --characterized--; and
Line 55, "characterised" should read --characterized--.

COLUMN 6:

Line 1, "characterised" should read --characterized--;
Line 6, "characterised" should read --characterized--;
Line 12, "characterised" should read --characterized--; and
Line 50, "organisation" should read --organization--.

COLUMN 7:

Line 9, "organised" should read --organized--.

COLUMN 10:

Line 46, "communication" should read --communication.--;
Line 47, "initialises" should read --initializes--; and
Line 59, "awaited" should read --awaited.--.

COLUMN 11:

Line 9, "V(S)" should read --V(S).--.

UNITED STATES PATENT AND TRADEMARK OFFICE
CERTIFICATE OF CORRECTION

PATENT NO. : 6,857,096 B1
APPLICATION NO. : 09/546686
DATED : February 15, 2005
INVENTOR(S) : Mohamed Braneci et al.

It is certified that error appears in the above-identified patent and that said Letters Patent is hereby corrected as shown below:

COLUMN 12:

Line 31, "initialised" should read --initialized--.
Line 32, "initialised" should read --initialized--.
Line 33, "initialised" should read --initialized--; and
Line 52, "characterised" should read --characterized--.

COLUMN 13:

Line 4, "characterising" should read --characterizing--;
Line 59, "organised" should read --organized--;
Line 61, "organised" should read --organized--; and
Line 62, "organisation" should read --organization--.

COLUMN 16:

Line 1, "sequence a" should be deleted.

COLUMN 20:

Line 12, "26 to 28" should read --26 to 27--; and
Line 56, "claims 24 to 29," should read --claims 26 to 28,--.

Signed and Sealed this

Twentieth Day of January, 2009

JON W. DUDAS
*Director of the United States Patent and Trademark Office*